United States Patent

Cho

[11] Patent Number: 6,127,887
[45] Date of Patent: Oct. 3, 2000

[54] HIGH GAIN, IMPEDANCE MATCHING LOW NOISE RF AMPLIFIER CIRCUIT

[75] Inventor: Thomas Byunghak Cho, Alameda, Calif.

[73] Assignee: Level One Communications, Inc., Sacramento, Calif.

[21] Appl. No.: 09/121,218

[22] Filed: Jul. 23, 1998

[51] Int. Cl.[7] .............................. H03F 3/68; H03F 3/04
[52] U.S. Cl. ...................................... 330/124 R; 330/302
[58] Field of Search .............................. 330/124 R, 295, 330/302

[56] References Cited

U.S. PATENT DOCUMENTS

| 3,585,516 | 6/1971 | Ricagni . |
| 3,675,145 | 7/1972 | Beurrier . |
| 3,784,932 | 1/1974 | Wisherd ..................................... 333/9 |
| 3,868,584 | 2/1975 | Beurrier .............................. 330/124 R |
| 5,548,246 | 8/1996 | Yamamoto et al. ..................... 330/302 |

FOREIGN PATENT DOCUMENTS 0 687 060 A2  12/1995  European Pat. Off. .

*Primary Examiner*—Robert Pascal
*Assistant Examiner*—Patricia T. Nguyen
*Attorney, Agent, or Firm*—Merchant & Gould P.C.

[57] ABSTRACT

A low noise amplifier circuit provides high gain and an input impedance matching a source output impedance by combining two amplifiers having different operational characteristics in parallel. The amplifier circuit includes a first amplifier having an input impedance matching a source and a gain less than a system requirement and a second amplifier having a gain meeting the system requirement and an input impedance substantially higher than the input impedance of the first amplifier, the second amplifier being connected in parallel to the first amplifier. The first amplifier includes an input and an output and the second amplifier includes an input and an output, the input to the first amplifier and the input to the second amplifier being connected to the source. A summer is provided for combining an output signal from the first amplifier with an output of the second amplifier. The input impedance of the first amplifier and the input impedance of the second amplifier provide an effective circuit impedance equal to an output impedance of the source. The first and the second amplifier include low noise RF amplifiers. Thus, the first and second amplifier provide an effective gain meeting the system requirement and an effective input impedance matching an output impedance of the source.

11 Claims, 2 Drawing Sheets

HIGH GAIN, IMPEDANCE MATCHING LOW NOISE RF AMPLIFIER CIRCUIT

BACKGROUND OF THE INVENTION

1. Field of the Invention

This invention relates in general to an RF amplifier, and more particularly to a low noise RF amplifier circuit that provides impedance matching with high gain.

2. Description of Related Art

Today's wireless communications markets are being driven by a multitude of user benefits. Products such as cellular phones, cordless phones, pagers, and the like have freed corporate and individual users from their desks and homes and are driving the demand for additional equipment and systems to increase their utility. As a result digital radio personal communications devices will play an increasingly important role in the overall communications infrastructure in the next decade.

Mixed-signal integration and power management have taken on added importance now that analog and mixed analog-digital ICs have become the fastest-growing segment of the semiconductor industry. Integration strategies for multimedia consoles, cellular telephones and battery-powered portables are being developed, as well as applications for less integrated but highly specialized building blocks that serve multiple markets. These building blocks include data converters, amplifiers and voltage regulators. Makers of amplifiers and regulators often eschew integration in CMOS, but strive for compact size and reduced costs with microminiature packaging.

One important aspect of digital radio personal communications devices is the integration of the RF sections of transceivers. Compared to other types of integrated circuits, the level of integration in the RF sections of transceivers is still relatively low. Considerations of power dissipation, form factor, and cost dictate that the RF/IF portions of these devices evolve to higher levels of integration than is true at present. Nevertheless, there are some key barriers to realizing these higher levels of integration.

For example, there are many applications where it's necessary to provide an RF amplifier at the input of a device for amplifying a signal from a source. For RF amplifiers, good input impedance matching to a source impedance is required for proper signal power transfer from the source to the amplifier. However, this requirement can set the limit on an amplifier's input transconductance thereby eliminating the maximum achievable gain by the amplifier. As a result, good impendance matching in combination with a high gain in excess of that is allowed by the normal input transconductance has been impossible.

It can be seen then that there is a need for an amplifier circuit that provides good impendance matching while providing maximum gain.

SUMMARY OF THE INVENTION

To overcome the limitations in the prior art described above, and to overcome other limitations that will become apparent upon reading and understanding the present specification, the present invention discloses a low noise amplifier circuit providing high gain and an input impedance matching a source output impedance.

The present invention solves the above-described problems by combining two amplifiers having different operational characteristics in parallel.

A system in accordance with the principles of the present invention includes a first amplifier having an input impedance matching a source and a gain less than a system requirement and a second amplifier having a gain meeting the system requirement and an input impedance substantially higher than the input impedance of the first amplifier, the second amplifier being connected in parallel to the first amplifier.

Other embodiments of a system in accordance with the principles of the invention may include alternative or optional additional aspects. One such aspect of the present invention is that the first amplifier includes an input and an output and the second amplifier includes an input and an output, the input to the first amplifier and the input to the second amplifier being connected to the source.

Another aspect of the present invention is that the amplifier circuit further includes a summer for combining an output signal from the first amplifier with an output of the second amplifier.

Another aspect of the present invention is that the input impedance of the first amplifier and the input impedance of the second amplifier provide an effective circuit impedance equal to an output impedance of the source.

Another aspect of the present invention is that the first and the second amplifier include low noise RF amplifiers.

Another aspect of the present invention is that the first and second amplifier provide an effective gain meeting the system requirement and an effective input impedance matching an output impedance of the source.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the exemplary embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

Whenever two components, sections, systems, etc. are connected in electronic systems, transmission lines matching issues must be addressed. If there exists a discontinuity in the line, line/load connection for example, the phenomenon of signal reflection occurs. The problem with this reflected signal is that it too carries power, and therefore, not all power is transferred to the load. The power lost to reflection can be very inhibiting. If the reflected signal is too great, it may even be damaging. Thus, the maximum transfer of power occurs when the impedance of the source equals the load.

Figure 1:
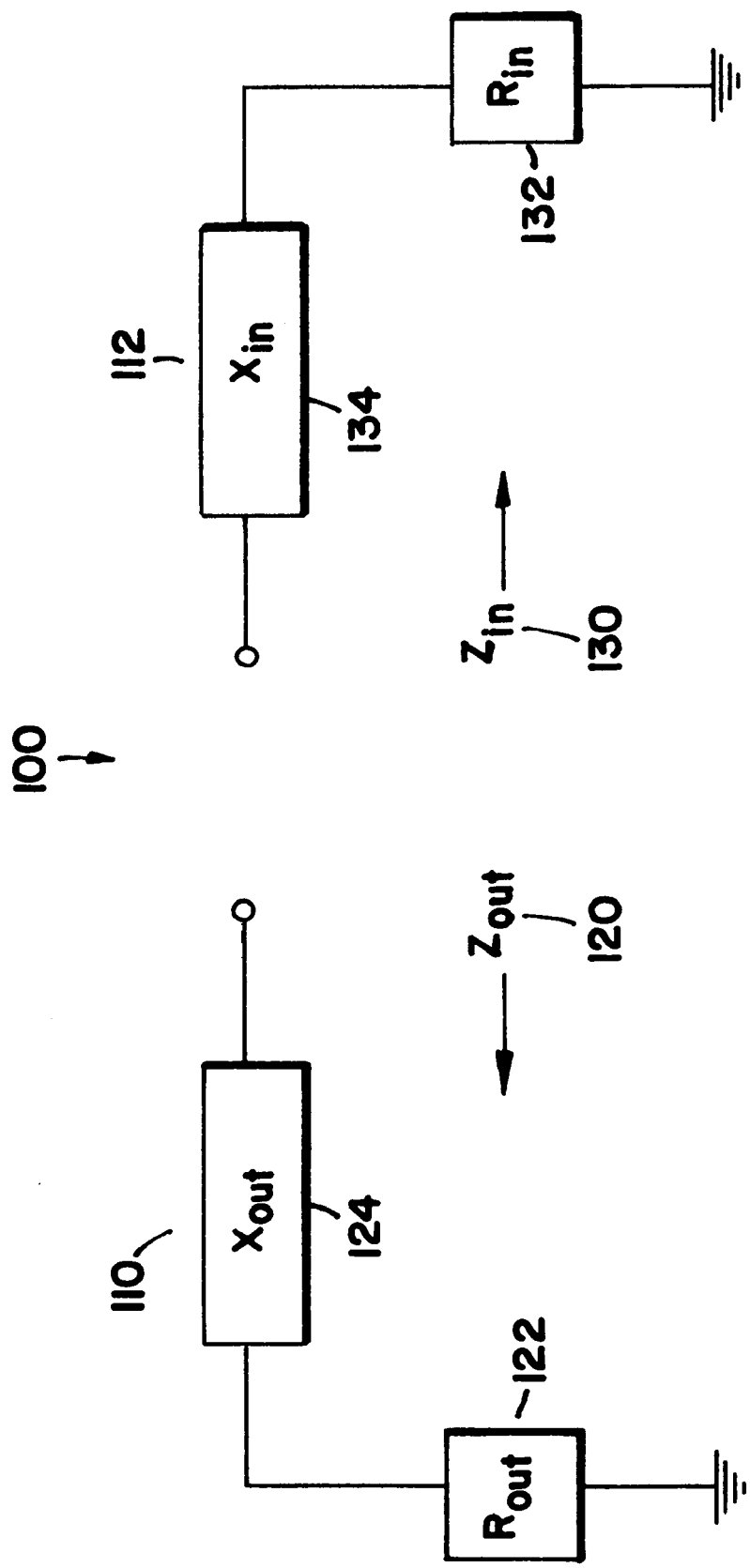
FIG. 1 illustrates the impedance phenomenon of a source and load.

FIG. 1 illustrates the impedance phenomenon 100 of a source 10 and load 112. In FIG. 1, the output impedance 120 of the source 110 is represented by a real or resistive component $R_{out}$ 122 and a reactive component $X_{out}$ 124. The input impedance 130 of the load 112 is represented by a real or resistive component $R_{in}$ 132 and a reactive component $X_{in}$ 134. To achieve maximum power transfer between the source 110 and the load 112, $Z_{in}$ 130 represented by $R_{in}+X_{in}$ must be equal to $Z_{out}$ 120 represented by $R_{out}+X_{out}$.

Typically, there are two ways to match the load impedance to the source impedance. First, a matching network may be used so that there is no reflection from the load to the generator. Often a quarter-wave transformer or a stub is used. The quarter-wave transformer is difficult to use since the adjustment of the inductance and $Z_{out}$ is difficult. Single stub matching is a better solution, since the length of the stub and the distance to the load are both easy to control.

Nevertheless, to reduce complexity, it is preferable for the load to be designed with an input impedance that matches the output impedance of the source if possible. However, with RF amplifiers, providing input impedance matching to the source impedance limits the gain since the input impedance of the amplifier is related to the amplifier's input transconductance.

Figure 2:
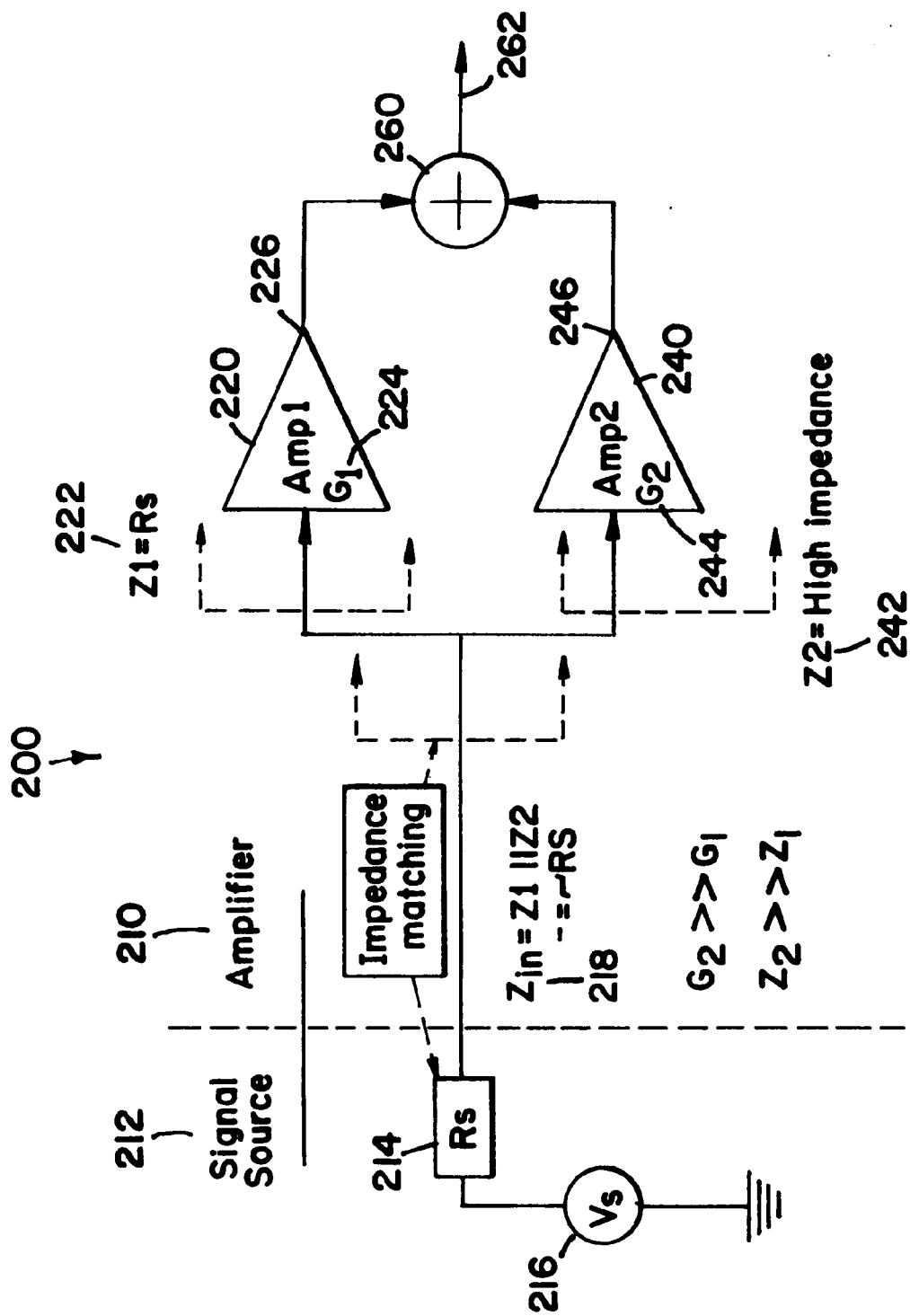
FIG. 2 illustrates a low noise amplifier circuit according to the present invention that provides high gain while matching the input impedance of the amplifier circuit to the output impedance of the source.

FIG. 2 illustrates an RF system 200 having a low noise amplifier circuit 210 according to the present invention connected to a source 212. The low noise amplifier circuit 210 provides high gain while matching the input impedance of the amplifier circuit 210 to the output impedance 214 of the source 212. In FIG. 2, the source is represented by a voltage source 216 and a characteristic impedance $R_s$ 214. Thus, the effective input impedance $Z_{in}$ 218 of the amplifier circuit 210 should be equal to the $R_s$ 214.

In FIG. 2, two amplifiers 220, 240 are arranged in parallel. The first amplifier 220 provides an input impedance $Z_1$ 222 equal to $R_s$ 214. The second amplifier 240 is selected to have a high input impedance $Z_2$ 242 and a gain $G_2$ 244 much greater than the gain $G_1$ 224 of the first amplifier 220. Thus, the effective impedance $Z_{in}$ 218 of the amplifier circuit 210 is:

$$Z_{in} = \frac{Z_1 Z_2}{Z_1 + Z_2},$$

where, $Z_2$ 242 is very large compared to $Z_1$ 222. Therefore, $Z_{in}$ 230 is approximately equal to $Z_1$ 222. Thus, the effective impedance $Z_{in}$ 218 looking into the combined amplifier circuit 210 is set by the input impedance $Z_1$ 222 of the first amplifier 220.

In addition, the output 226 of the first amplifier 220 is combined with the output 246 of the second amplifier 240 at a summing node 260. The gain $G_2$ 244 of the second amplifier 240 may be made to be much higher than the gain $G_1$ 224 of the first amplifier 220 due to the absence of the input transconductance limitation inherent in the low impedance first amplifier 220. Thus, the effective signal strength at the output 262 of the summing node 260 can be made to meet the system requirements, principally through the gain $G_2$ 244 of the second amplifier 240.

In summary, the amplifier circuit architecture according to the present invention provides impedance matching to the signal source while simultaneously providing high gain.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. An amplifier circuit for receiving a signal from a source, comprising:
   a first amplifier having an input impedance matching a source and a gain less than a system requirement; and
   a second amplifier having a gain meeting the system requirement and an input impedance substantially higher than the input impedance of the first amplifier, the second amplifier being connected in parallel to the first amplifier.

2. The amplifier circuit of claim 1 wherein the first amplifier comprises an input and an output and the second amplifier comprises an input and an output, the input to the first amplifier and the input to the second amplifier being connected to the source.

3. The amplifier circuit of claim 1 further comprising a summer for combining an output signal from the first amplifier with an output of the second amplifier.

4. The amplifier circuit of claim 1 wherein the input impedance of the first amplifier and the input impedance of the second amplifier provide an effective circuit impedance equal to an output impedance of the source.

5. The amplifier circuit of claim 1 wherein the first and the second amplifier comprise low noise RF amplifiers.

6. The amplifier circuit of claim 1 wherein the first and second amplifier provide an effective gain meeting the system requirement and an effective input impedance matching an output impedance of the source.

7. A low noise amplifier circuit for providing a gain meeting a system requirement and an effective input impedance matching an output impedance of a source, comprising:
   a first amplifier having a first input impedance and a first gain; and
   a second amplifier, coupled in parallel to the first amplifier, the second amplifier having a second input impedance and a second gain, the second gain being substantially greater than the first gain;
   wherein the first input impedance and the second input impedance combine to equal the output impedance of the source and wherein the first and second gains combine to meet the system requirement.

8. The amplifier circuit of claim 7 wherein the first amplifier comprises an input and an output and the second amplifier comprises an input and an output, the input to the first amplifier and the input to the second amplifier being connected in parallel to the source.

9. The amplifier circuit of claim 7 further comprising a summer for combining an output signal from the first amplifier with an output of the second amplifier to combine the first and second gains to meet the system requirement.

10. The amplifier circuit of claim 1 wherein the first and the second amplifier comprise low noise RF amplifiers.

11. A low noise amplifier circuit for providing a gain meeting a system requirement and an effective input impedance matching an output impedance of a source, comprising:
   a first low noise RF amplifier having an input and an output, the first low noise RF amplifier further comprising a first input impedance and a first gain;
   a second low noise RF amplifier, coupled in parallel to the first low noise RF amplifier, the second low noise RF amplifier having an input and an output, the second low noise RF amplifier further comprising a second input impedance and a second gain, the second gain being substantially greater than the first gain; and a summer for combining the output signal from the first low noise RF amplifier with the output of the second low noise RF amplifier to provide an effective gain meeting the system requirement and wherein the input to the first amplifier and the input to the second amplifier are connected in parallel to the source to provide an effective input impedance matching the output impedance of the source.

* * * * *